(12) United States Patent
Kawano

(10) Patent No.: US 8,441,334 B2
(45) Date of Patent: May 14, 2013

(54) ELECTRONIC CIRCUIT AND ELECTRONIC DEVICE

(75) Inventor: Yoichi Kawano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/975,726

(22) Filed: Dec. 22, 2010

(65) Prior Publication Data

US 2011/0163824 A1  Jul. 7, 2011

(30) Foreign Application Priority Data

Jan. 5, 2010 (JP) ................... 2010-000694
Sep. 29, 2010 (JP) ................... 2010-219944

(51) Int. Cl.
*H01F 5/00* (2006.01)

(52) U.S. Cl.
USPC ........................................... 336/200

(58) Field of Classification Search ........ 336/65, 336/200, 232; 257/531
See application file for complete search history.

(56) References Cited

U.S. PATENT DOCUMENTS

| | | | | |
|---|---|---|---|---|
| 4,816,784 A | * | 3/1989 | Rabjohn | 333/24 R |
| 5,583,474 A | * | 12/1996 | Mizoguchi et al. | 336/83 |
| 6,573,822 B2 | * | 6/2003 | Ma et al. | 336/223 |
| 7,202,768 B1 | * | 4/2007 | Harvey et al. | 336/232 |
| 7,733,206 B2 | * | 6/2010 | Park | 336/200 |
| 2002/0158711 A1 | * | 10/2002 | Groves et al. | 333/174 |
| 2005/0068146 A1 | * | 3/2005 | Jessie | 336/200 |
| 2008/0055037 A1 | * | 3/2008 | Watanabe et al. | 336/200 |
| 2008/0129434 A1 | * | 6/2008 | Khajehpour | 336/139 |

FOREIGN PATENT DOCUMENTS

| | | | |
|---|---|---|---|
| JP | 09035942 A | * | 2/1997 |
| JP | 2006-32579 | | 2/2006 |

OTHER PUBLICATIONS

C.-T. Fu, et al.; "A 2.4-5.4-GHz Wide Tuning-Range CMOS Reconfigurable Low-Noise Amplifer," IEEE Transactions on Microwave Theory and Techniques; vol. 56; No. 12; Dec. 2008; pp. 2754-2763 (10 Sheets.)/Page 1 of specification.

Office Action dated Feb. 23, 2012 issued in corresponding Korean Patent Application No. 10-2011-0000054 with English translation.

* cited by examiner

*Primary Examiner* — Tuyen Nguyen

(74) *Attorney, Agent, or Firm* — Kratz, Quintos & Hanson, LLP

(57) ABSTRACT

An electronic circuit includes a first inductor, a second inductor that is magnetically coupled with the first inductor, induced current flowing through the second inductor by a magnetic field generated by the first inductor, and a current changing part that is connected to the second inductor and is configured to change the induced current that flows through the second inductor.

16 Claims, 15 Drawing Sheets

ELECTRONIC CIRCUIT AND ELECTRONIC DEVICE

CROSS-REFERENCE TO RELATED APPLICATION

This application is based upon and claims the benefit of priority of the prior Japanese Patent Applications No. 2010-000694 and 2010-219944, respectively filed on Jan. 5, 2010 and Sep. 29, 2010, the entire contents of which applications are incorporated herein by reference.

FIELD

A certain aspect of the embodiments discussed herein is related to an electronic circuit and an electronic device using a variable inductor.

BACKGROUND

Conventionally, there is known a variable inductor having a variable inductance in operation. For example, a variable inductor is configured to provide switches connected to ground in multiple positions on a wiring formed in a spiral shape and to change the effective length of the wiring by turning ON or OFF the switches. The inductance of the wiring formed in the spiral shape depends on the total length of the wiring. Thus, the inductance may be arbitrarily changed by changing the positions in which the switches are turned ON (see Chang-Tsung Fu, Chun-Lin Ko, Chien-Nan Kuo, and Ying-Zong, "A 2.4-5.4 GHz Wide Tuning-Range CMOS Reconfigurable Low-Noise Amplifier", IEEE TRANSACTIONS ON MICROWAVE THEORY AND TECHNIQUES, Vol. 56, No. 12, DECEMBER 2008, for example).

More specifically, the above-described variable inductor is configured to connect one of two input/output terminals of the variable inductor to ground via a switch. Thus, the above inductor may be used as only a shunt inductor, and may be applied to a limited range.

SUMMARY OF THE INVENTION

According to an aspect of the present invention, there is provided an electronic circuit including: a first inductor; a second inductor that is magnetically coupled with the first inductor, induced current flowing through the second inductor by a magnetic field generated by the first inductor; and a current changing part that is connected to the second inductor and is configured to change the induced current that flows through the second inductor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
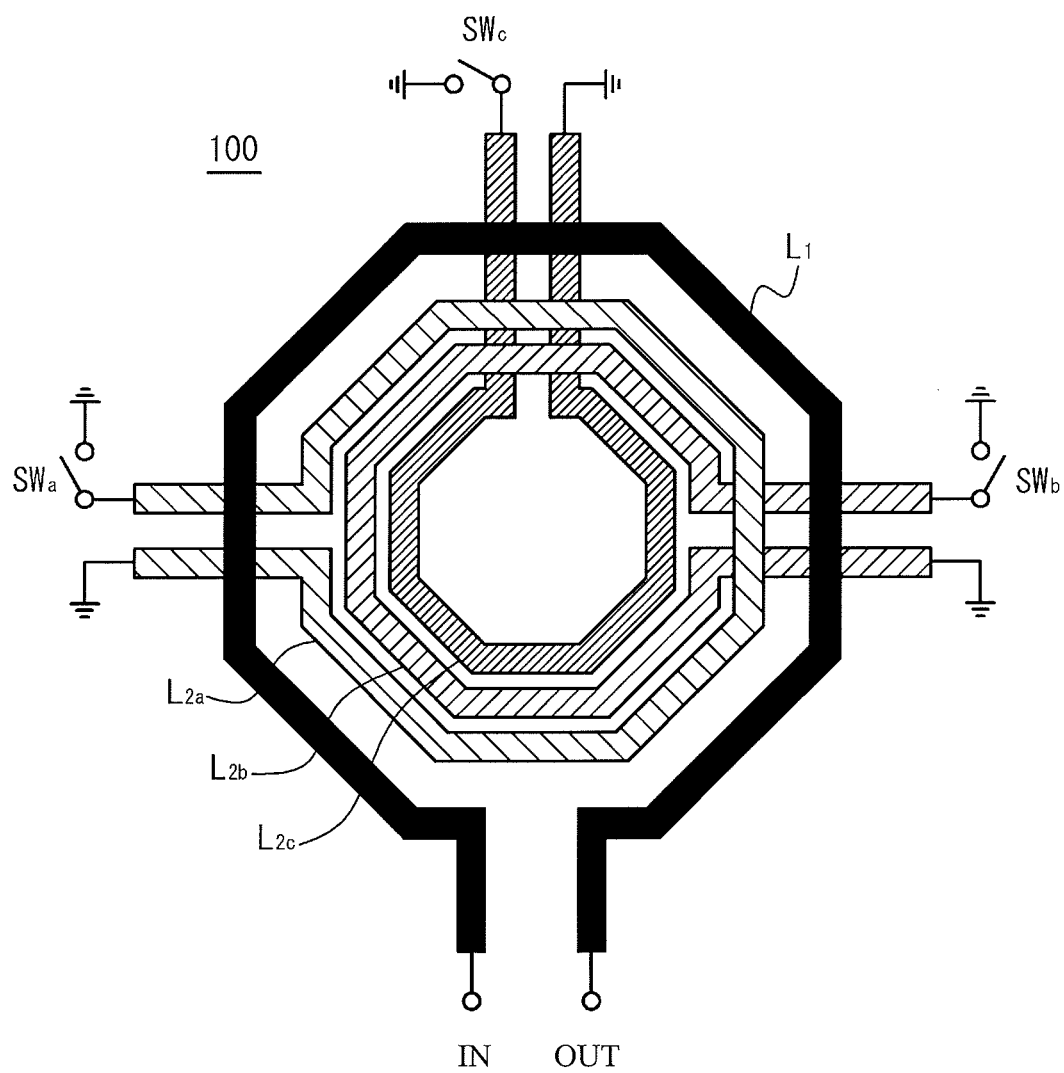
FIG. 1 is a diagram of a structure of a variable inductor in accordance with a first embodiment.

FIG. 1 is a schematic plan view that illustrates a structure of a variable inductor in accordance with a first embodiment. A variable inductor 100 includes a first inductor $L_1$, and second inductors $L_{2a}$ through $L_{2c}$ magnetically coupled with the first inductor $L_1$.

The first inductor $L_1$ is a ring-shaped inductor through which an electric signal flows actually, and is equipped with an input terminal IN and an output terminal OUT. The electric signal includes an AC signal (for example, RF or high frequency signal). The input terminal IN is connected to a circuit of the previous stage (for example, an output terminal of an amplifier).

The second inductors $L_{2a}$ through $L_{2c}$ are ring-shaped inductors for changing the inductance of the first inductor $L_1$, and are arranged inside the first inductor $L_1$. The second inductors $L_{2a}$ through $L_{2c}$ are magnetically coupled with the first inductor $L_1$. Induced currents flow through the second inductors $L_{2a}$ through $L_{2c}$ due to the magnetic field generated by the inductor $L_1$. The second inductors $L_{2a}$ through $L_{2c}$ have different inner diameters. The inductor $L_{2a}$ has the greatest inner diameter, and the inductor $L_{2c}$ has the smallest inner diameter. Although the present embodiment employs three second inductors $L_2$, the number of second inductors $L_2$ may be an arbitrary number equal to or greater than 1.

Each of the second inductors $L_2$ has two terminals. One of the two terminals is connected to ground, and the other is connected to a switch SW. The switch SW shunts the second inductor $L_2$ in the ON state, and opens the second inductor $L_2$ in the OFF state.

Figure 2:
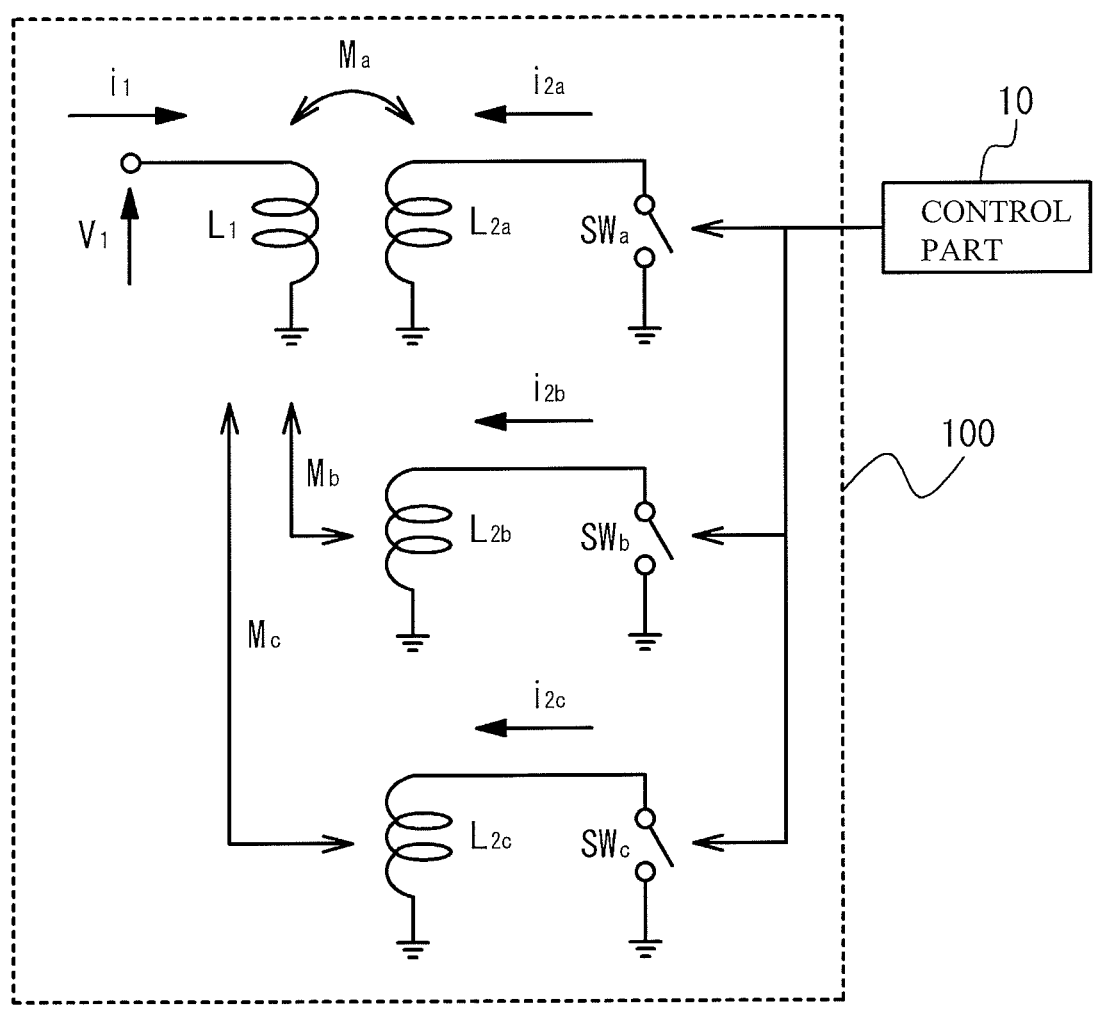
FIG. 2 is a circuit diagram of the variable inductor in accordance with the first embodiment.

FIG. 2 is a circuit diagram of the variable inductor in accordance with the first embodiment. The relation between the first inductor $L_1$ and the second inductors $L_{2a}$ through $L_{2c}$ is similar to that between the primary coil and the secondary coil of the transformer. Switches $SW_a$ through $SW_c$ respectively connected to the second inductors $L_{2a}$ through $L_{2c}$ are controlled by a control part 10.

It is assumed that the current that flows through the first inductor $L_1$ is $i_1$ and the inductance of the first inductor $L_1$ is $L_1$. It is further assumed that the current that flows through the second inductor $L_{2a}$ is $i_{2a}$, the inductance of the second inductor $L_{2a}$ is $L_{2a}$, and the mutual inductance between the first inductor $L_1$ and the second inductor $L_{2a}$ is $M_a$. Similar parameters to those of the second inductor $L_{2a}$ are defined for the second inductors $L_{2b}$ and $L_{2c}$. The frequency of the input signal (AC signal) is defined as $\omega$. A voltage $V_1$ applied to the first inductor $L_1$ is described by the following expression in connection with the second inductor $L_2$:

$$V_1 = j\omega L_1 i_1 + j\omega M i_2 \tag{1}$$

By dividing both sides of expression (1) by current i1, the impedance Z1 of the first inductor $L_1$ is obtained as indicated by expression (2) described below:

$$Z_1 = j\omega L_1 + j\omega (KL_1 L_2) i_2 / i_1 \tag{2}$$

By dividing both sides of expression (2) by the frequency $j\omega$, the inductance L of the first inductor $L_1$ is obtained as indicated by expression (3) described below:

$$L = L_1 + (KL_1 L_2) i_2 / i_1 \tag{3}$$

When the switch SW is turned OFF by an instruction issued by the control part 10, the second inductor $L_2$ is opened and the circuit impedance becomes infinite. Thus, the current $i_2$ that flows on the second inductor $L_2$ side substantially becomes zero. Thus, the second term of the right side of expression (3) is zero, and the inductance L of the first inductor $L_1$ becomes equal to the self-inductance $L_1$. That is, the case where the switch SW is turned OFF is equivalent to a case where the second inductor $L_2$ does not exist.

When the switch SW is turned ON by an instruction issued by the control part 10, the second inductor $L_2$ is shunted, and current dependent on the circuit impedance flows. Thus, the current $i_2$ assumes a given value that is not equal to zero. Thus, the inductance L of the first inductor $L_1$ is the sum of a contributory factor from the second inductor $L_2$ to the self-inductance $L_1$. Actually, the second term of the right side of equation (3) assumes a negative value, and the inductance L of the first inductor $L_1$ is thus smaller than $L_1$.

A description will be given of the degree of magnetic coupling between the first inductor $L_1$ and the second inductor $L_2$. The degree of magnetic coupling is a parameter indicated as K in equations (2) and (3), and shows how much the magnetic flux generated in one of the two coils is transferred to the other. When all of the magnetic flux is transferred, the degree K of magnetic coupling is equal to 1. When the magnetic flux is not transferred at all, the degree K of magnetic coupling is 0. It is seen from expressions (1) and (2), the mutual inductance M is defined by multiplying the self-inductances of the first and second inductors $L_1$ and $L_2$ by the degree K of magnetic coupling.

The degree K of magnetic coupling depends on the size of the inner diameter of the second inductor $L_2$ to the first inductor $L_1$. In a case where the second inductor $L_2$ is located inside the first inductor $L_1$, the value of K becomes greater as the inner diameter becomes greater, and becomes smaller as the inner diameter becomes smaller. That is, the second inductors $L_{2a}$ through $L_{2c}$ having the different inner diameters have different values of K ($K_a$ of the second inductor $L_{2a}$ is the greatest and $L_c$ of the second inductor $L_{2c}$ is the smallest).

The control part 10 controls the switches SWa through SWc of the multiple second inductors L2a through L2c to be turned ON or OFF, and controls currents i2a through i2c that flow through the second inductors L2a through L2c, respectively. As has been described previously, it is possible to ignore the influence of the second inductor $L_2$ associated with the switch SW that is in the OFF state. It is thus possible to control the value of the degree K of magnetic coupling that influences the first inductor $L_1$ by selectively turning ON the switches $SW_a$ through $SW_c$.

Figure 3:
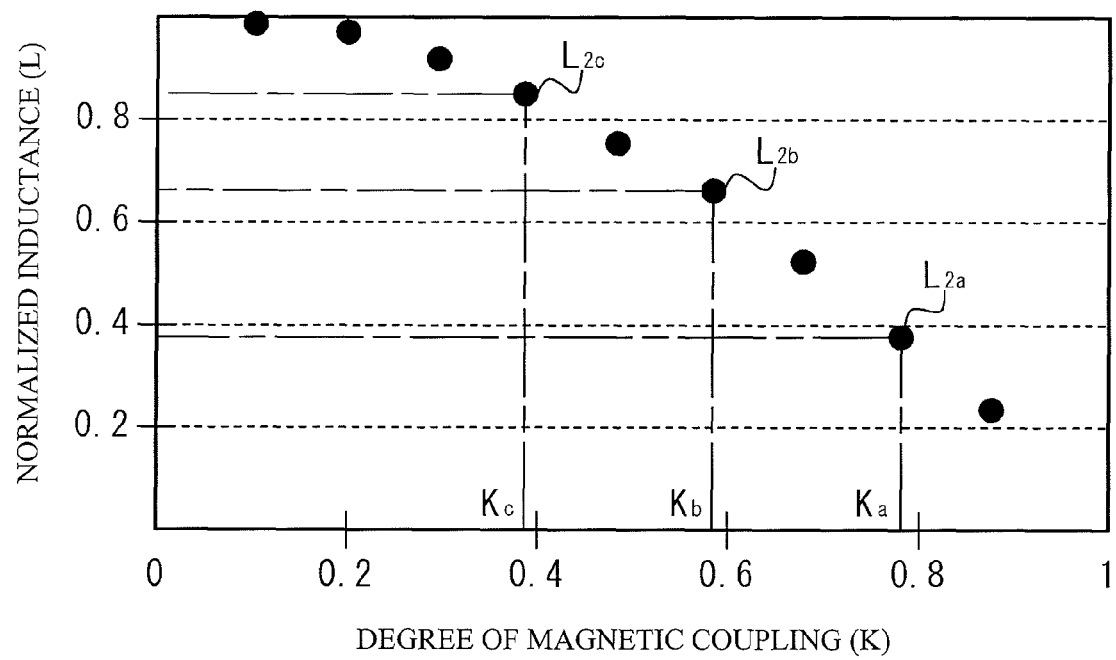
FIG. 3 is a graph that illustrates a relation between the degree of magnetic coupling and the inductance of the variable inductor in accordance with the first embodiment.

FIG. 3 is a graph that illustrates a relation between the degree K of magnetic coupling and the inductance L of the variable inductor in accordance with the first embodiment. The inductance L is normalized so that the value obtained when the second inductor $L_2$ does not exist is set as a standard. The degree K of magnetic coupling has discrete values because it depends on the inner diameter of the second inductor $L_2$. Accordingly, the normalized inductance L have discrete values between 0.2 and 1. Theoretically, the normalized inductance L may be changed between 0 and 1. However, the normalized inductance L may have a lower limit as small as about 0.2 due to the limitation on downsizing of the second inductor $L_2$.

The control part 10 controls the switches SWa through SWc to change the degree K of magnetic coupling and change the inductance L of the first inductor $L_1$. For example, as illustrated in FIG. 3, the degree $K_a$ of magnetic coupling of the second inductor $L_{2a}$ is set equal to about 0.8, the degree $K_b$ of magnetic coupling of the second inductor $L_{2b}$ is set equal to about 0.6, and the degree $K_c$ of magnetic coupling of the second inductor $L_{2c}$ is set equal to about 0.4. For example, when it is attempted to set the normalized inductance equal to about 0.4, the control part 10 turns ON only the switch $SW_a$ associated with the second inductor $L_{2a}$, and turns OFF the other switches. Thus, only the second inductor $L_{2a}$ having the degree $K_c$ of magnetic coupling nearly equal to 0.8 influences the inductance L of the first inductor $L_1$, so that the inductance of the variable inductor 100 may be set equal to the above attempted value. The control part 10 may turn ON the multiple switches simultaneously. However, it is preferable to turn ON only one of the switches $SW_a$ through $SW_c$ and turn OFF the remaining switches in order to reduce power consumption.

As described above, the variable inductor 100 in accordance with the first embodiment is capable of easily changing the inductance by controlling the switches SWa through SWc respectively connected to the second inductors $L_{2a}$ through $L_{2c}$. It is not required to connect one of the two input/output terminals to ground, and the variable inductor 100 may be used as an inductor other than the shunt inductor. Thus, a wider application range is available.

In the first embodiment, the second inductors $L_2$ are provided inside the first inductor $L_1$. Alternatively, the second inductors $L_2$ may be provided outside the first inductor $L_1$.

Figure 4:
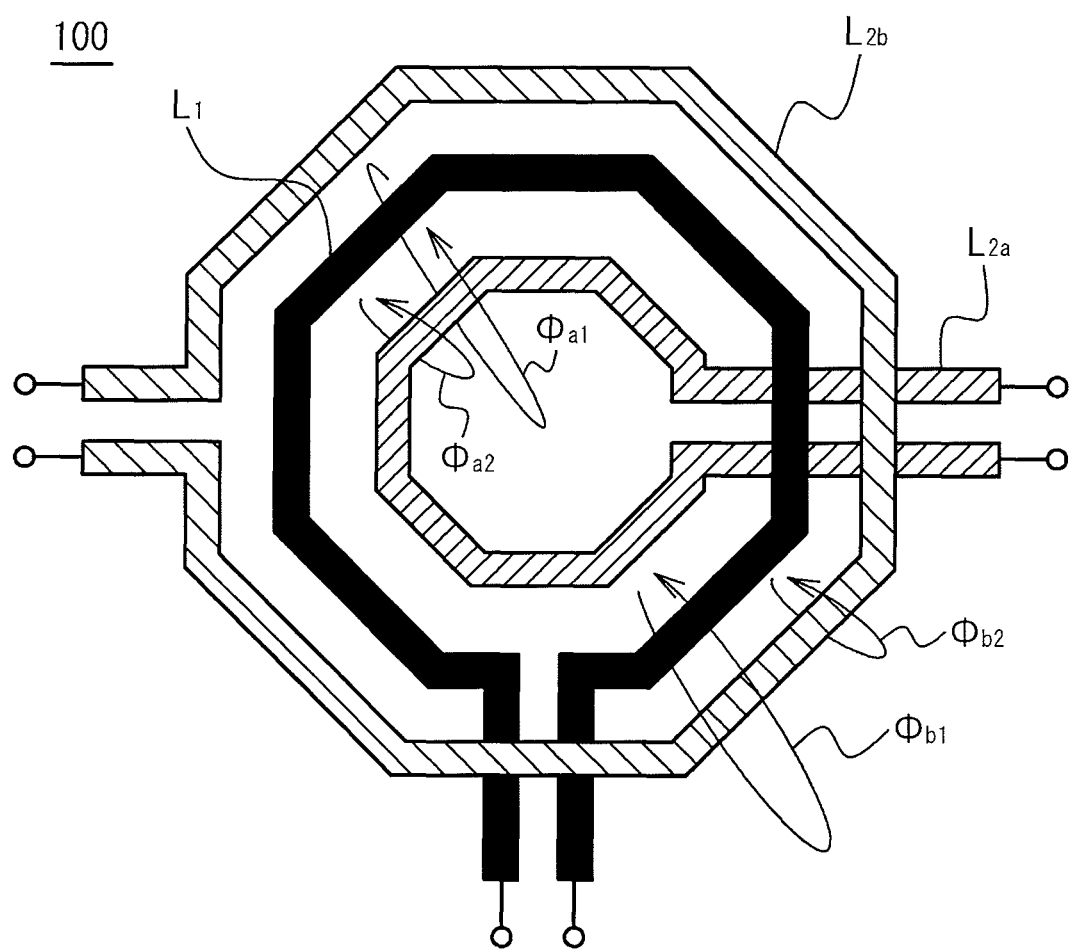
FIG. 4 is a diagram that illustrates an operation of the variable inductor in accordance with the first embodiment.

FIG. 4 is a diagram that illustrates an operation of the variable inductor 100. Structural elements such as switches are omitted. In a case where the second inductor $L_{2a}$ is provided inside the first inductor $L_1$, a magnetic flux $\Phi_{a1}$ that is part of the magnetic flux generated by the second inductor $L_{a2}$ and passes outside the first inductor $L_1$ influences the first inductor $L_1$, while a magnetic flux $\Phi_{a2}$ does not influence the first inductor $L_1$. Similarly, in a case where the second inductor $L_{2b}$ is provided outside the first inductor $L_1$, a magnetic flux $\Phi_{b1}$ that is part of the magnetic flux generated by the second inductor $L_{2b}$ and passes inside the first inductor $L_1$ influences the first inductor $L_1$, while a magnetic flux $\Phi_{b2}$ does not influence the magnetic flux $L_1$. Thus, no matter whether the second inductor $L_2$ is provide outside or inside the first inductor $L_1$, the value of the degree K of magnetic coupling is greater than 0 and smaller than 1. In terms of reduction in wiring resistance and power consumption, the second inductor $L_2$ is preferably provided inside the first inductor $L_1$.

As described above, the first embodiment employs the second inductors $L_{2a}$ through $L_{2c}$ having the different inner diameters in order to change the degree K of magnetic coupling between the first inductor $L_1$ and the second inductor $L_2$. The degree K of magnetic coupling may be changed by a method other than the above.

Figure 5A:
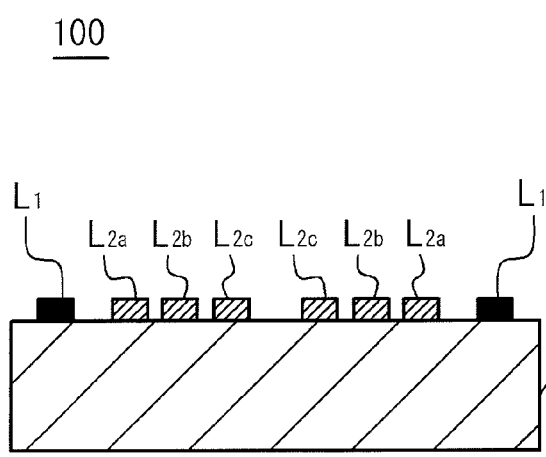
FIG. 5A is a cross-sectional view of the variable inductor in accordance with the first embodiment.

FIG. 5A is a cross-sectional view of the variable inductor 100 in accordance with the first embodiment. The first inductor $L_1$ and the second inductors $L_{2a}$ through $L_{2c}$ are formed on a substrate 20 by wiring patterns. That is, the first inductor $L_1$ and the second inductors $L_{2a}$ through $L_{2c}$ are formed on an identical layer.

Figure 5B:
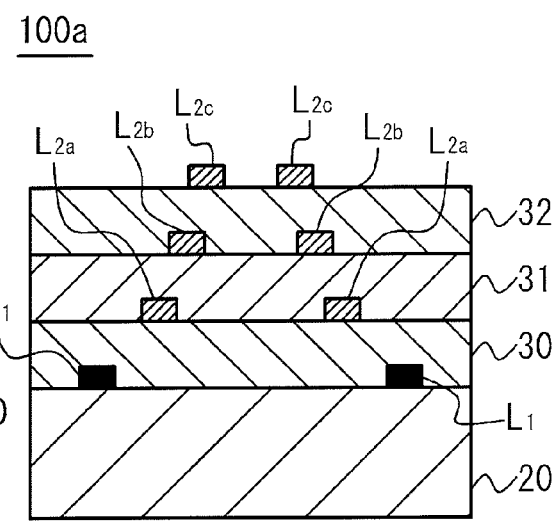
FIG. 5B is a cross-sectional view of a variation of the variable inductor in accordance with the first embodiment.

FIG. 5B is a cross-sectional view of a variable inductor 100a in accordance with a variation of the first embodiment. The first inductor $L_1$ is formed on the substrate 20 by a wiring pattern, and the substrate 20 and the first inductor $L_1$ are covered with an interposed insulating layer 30. The second inductor $L_{2a}$ is formed on the insulating layer 30 by a wiring pattern, and the insulating layer 30 and the second inductor $L_{2a}$ are covered with an interposed insulating layer 31. Similarly, the second inductor $L_{2b}$ is formed on the insulating layer 31, and the insulating layer 30 and the second inductor $L_{2b}$ are covered with an insulating layer 32. The second inductor $L_{2c}$ is formed on the insulating layer 32.

As illustrated in FIG. 5B, by forming the second inductors $L_{2a}$ through $L_{2c}$ on the different layers, the different distances from the substrate 20 on which the first inductor $L_1$ is formed are available, and the different values of the degrees $K_a$ through $K_c$ of magnetic coupling are available. As the distance between the substrate 20 and the second inductor $L_2$ increases, the number of magnetic fluxes that are generated by the second inductor $L_2$ and pass through the first inductor $L_1$ decreases, and the degree K of magnetic coupling decreases. In the case where the multiple second inductors $L_2$ are formed on the different layers, as illustrated in FIG. 5B, the second inductors $L_2$ may have overlapping portions in the stacking direction (the axial direction of the second inductors $L_2$). It is thus possible to reduce the space in which the variable inductor 100a is formed.

In the first embodiment, the number of turns of each inductor is equal to 1 (FIG. 1). The first inductor $L_1$ and the second inductors $L_2$ may have an arbitrary number of turns. The inductors are not limited to the ring-like shapes but may be formed in various shapes.

Second Embodiment

A second embodiment has an exemplary structure in which a switch and an additional impedance are added to the variable inductor.

Figure 6:
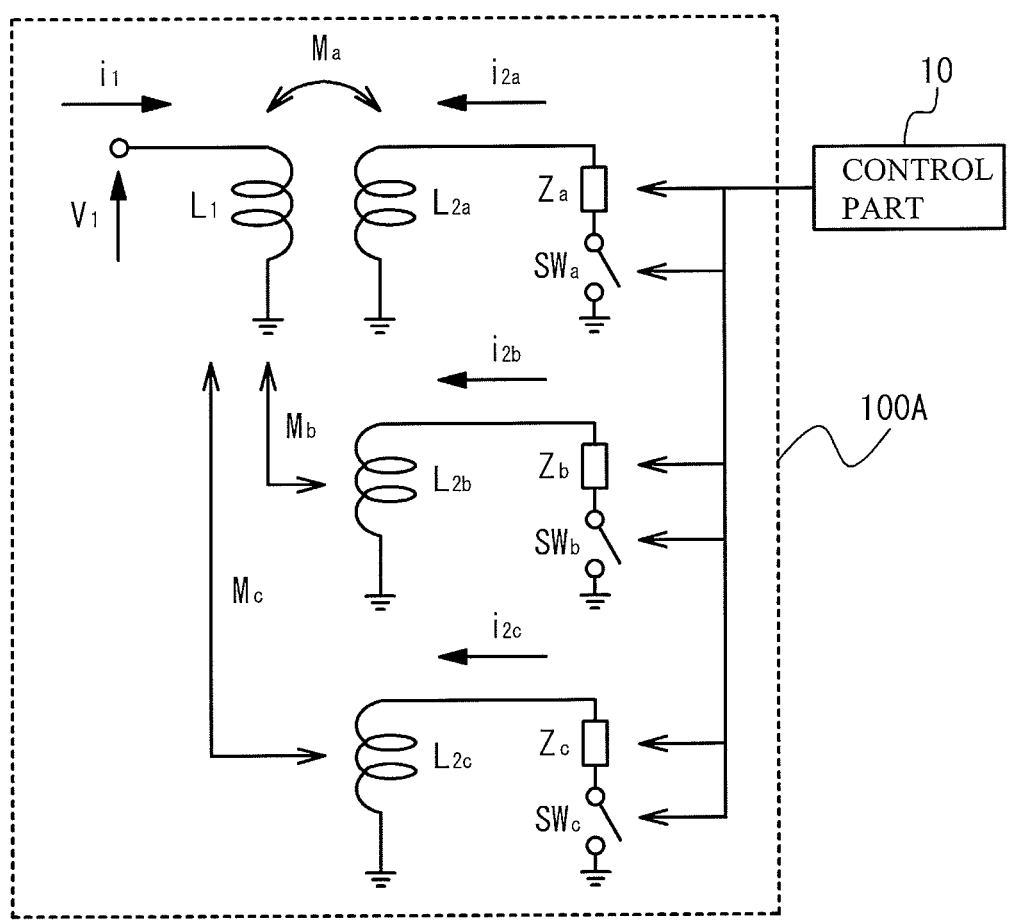
FIG. 6 is a circuit diagram of a variable inductor in accordance with a second embodiment.

FIG. 6 is a circuit diagram of a variable inductor 100A in accordance with the second embodiment. Additional impedances $Z_{2c}$ through $Z_c$ are connected to the second inductors $L_{2a}$ through $L_{2c}$, respectively. The additional impedances $Z_a$ through $Z_c$ are variable elements having variable impedances, and are controlled by the control part 10. The other structures of the second embodiment are the same as those of the first embodiment (FIG. 2), and a description thereof will be omitted here.

When the switches SW are ON, the control part 10 changes the impedances of the additional impedances Z, and changes the currents i2 that flow the second inductors $L_2$. The additional impedances Z may be a varactor diode (variable capacitance diode).

Figure 7:
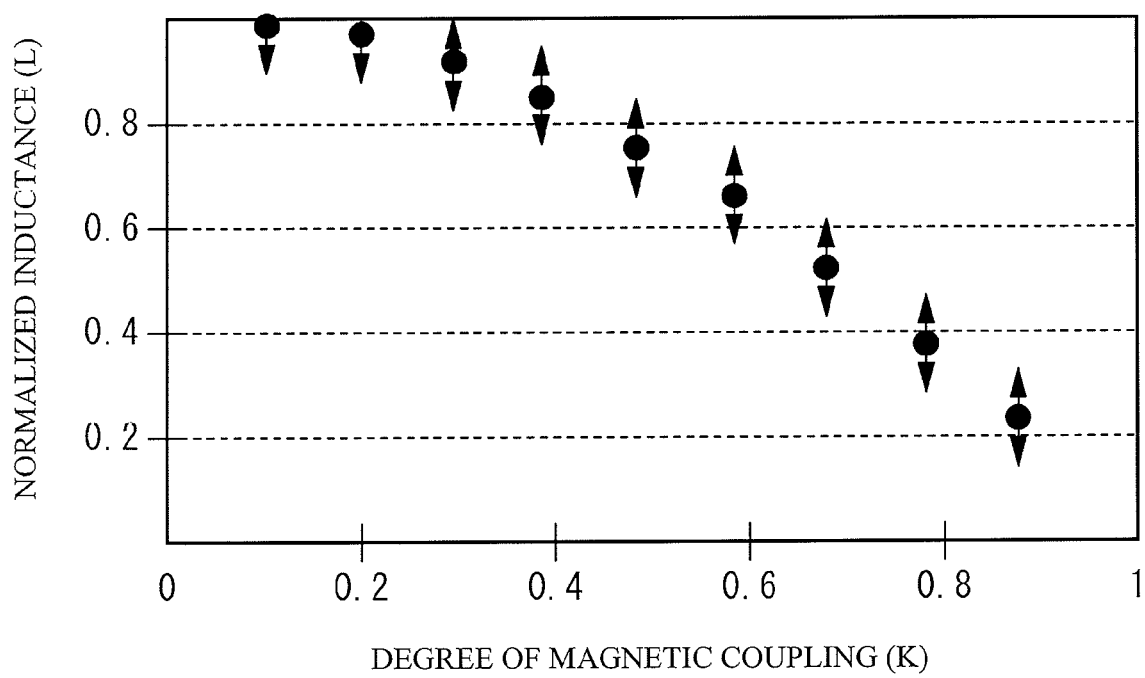
FIG. 7 is a graph that illustrates a relation between the degree of magnetic coupling and the inductance of the variable inductor in accordance with the second embodiment.

FIG. 7 is a graph that illustrates the relation between the degree of magnetic coupling and inductance of the variable inductor configured according to the second embodiment. The second embodiment is similar to the first embodiment (FIG. 3) in that the degree K of magnetic coupling takes discrete values. By changing the additional impedances Z, it is possible to continuously change the normalized inductance for the same degree K of magnetic coupling within a certain range. This makes it possible to finely change the inductance of the variable inductor 100, as compared to the first embodiment.

The variable inductors 100 and 100A of the first and second embodiments are equipped with the first inductor $L_1$ and the multiple second inductors $L_2$ that are magnetically coupled with the first inductor $L_1$ and are assigned the different degrees of magnetic coupling. The variable inductors 100 and 100A are equipped with the current changing part for changing the currents that flow through the second inductors $L_2$. With these structures, it is possible to realize the variable inductor that is widely used in various applications other than the shunt inductor and is capable of easily changing the inductance.

In the first embodiment, the current changing part includes the switching part. The switching part changes the currents that flow through the second inductors $L_2$ to zero or predetermined values other than zero. The use of the switching part makes it possible to easily change the inductance. The switches $SW_a$ through $SW_c$ are examples of the switching part, and the switching part is not limited to these switches but may have another structure having a similar function.

In the second embodiment, the current changing part includes the switching part and the adjusting part. The adjusting part increases or decreases the currents that flow through the second inductors $L_2$ within the given ranges including the above predetermined values. The use of the adjusting part enables finer adjustment of inductance. The additional impedances $Z_a$ through $Z_c$ are examples of the adjusting part. The adjusting part is not limited to the above additional impedances but may have another structure having a similar function.

In the first and second embodiments, the multiple second inductors $L_{2a}$ through $L_{2c}$ having the different inner diameters are arranged inside the first inductor $L_1$. With this arrangement, it is possible to easily realize the variable inductor having the aforementioned operations.

The current changing part may be implemented by a structure other than the combination of the switching part and the adjusting part. The multiple variations of the first embodiment that have been described may be applied to the variable inductor 100A of the second embodiment.

Third Embodiment

A third embodiment is an example of a filter circuit using the variable inductor configured according to the first or second embodiment. As examples of the filter circuit of the third embodiment, a high-pass filter and a low-pass filter are now described.

Figure 8A:
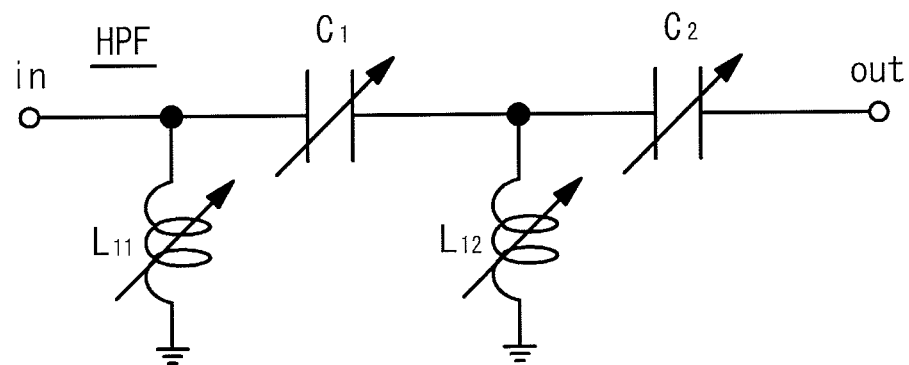
FIG. 8A is a circuit diagram of a high-pass filter in accordance with a third embodiment.
Figure 8B:
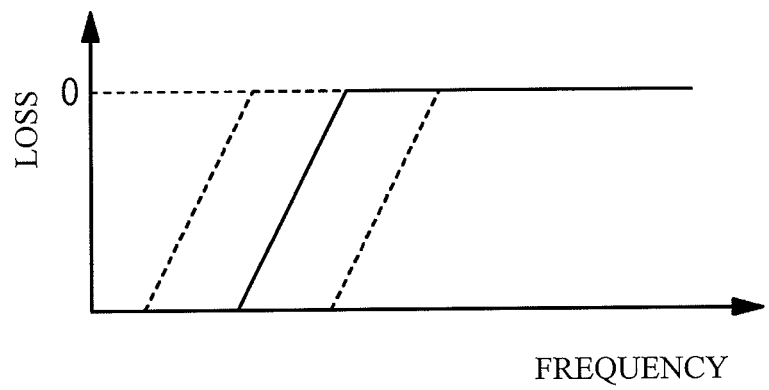
FIG. 8B is a graph of a circuit characteristic thereof.

FIG. 8A is a circuit diagram of a high-pass filter in accordance with the third embodiment, and FIG. 8B is a graph of a circuit characteristic thereof. As depicted in FIG. 8A, a high-pass filter HPF has capacitors connected in series between an input terminal in and an output terminal out. An inductor $L_{11}$ is connected between an intermediate node between the input terminal in and the capacitor $C_1$ and ground, and inductor $L_{12}$ is connected between an intermediate node between the capacitors $C_1$ and $C_2$ and ground.

The structures of the inductors $L_{11}$ and $L_{12}$ are the same as the structure of the variable inductor 100 of the first or second embodiment. Although the capacitors $C_1$ and $C_2$ are variable capacitors in FIG. 8A, the capacitors $C_1$ and $C_2$ may have constant capacitances. As illustrated in FIG. 8B, by changing the inductances of the inductors $L_{11}$ and $L_{12}$, it is possible to change the circuit characteristic of the high-pass filter HPF and to change the frequency response.

Figure 9A:
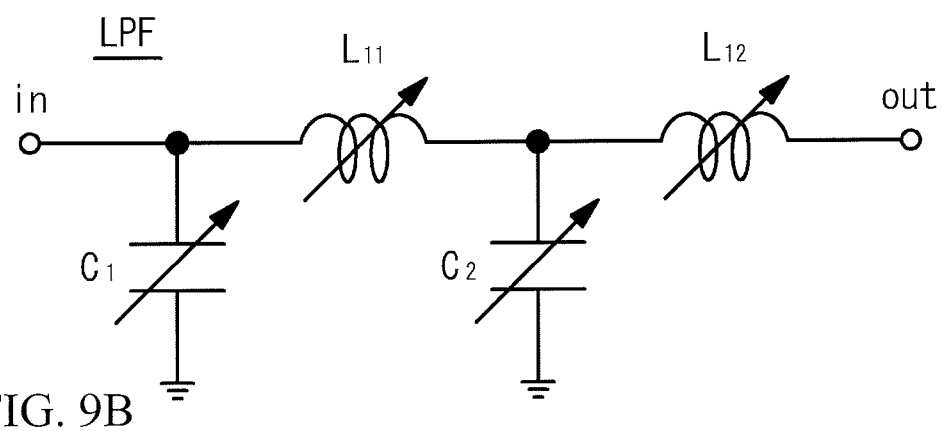
FIG. 9A is a circuit diagram of a low-pass filter in accordance with the third embodiment.
Figure 9B:
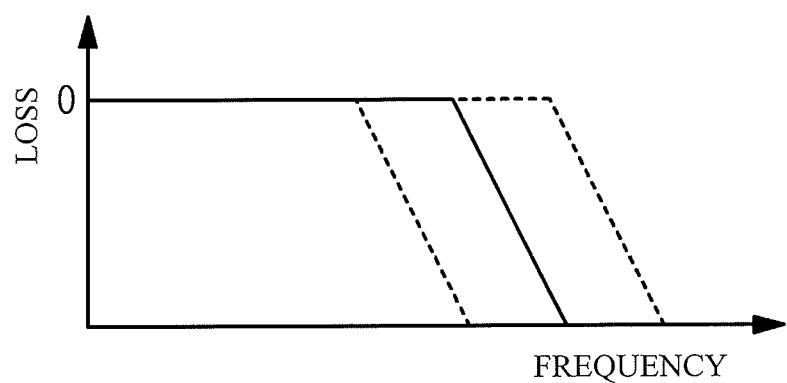
FIG. 9B is a graph of a circuit characteristic thereof.

FIG. 9A is a circuit diagram of a low-pass filter in accordance with the third embodiment, and FIG. 9B is a graph of a circuit characteristic thereof. As depicted in FIG. 9A, a low-pass filter LPF has inductors $L_{11}$ and $L_{12}$ connected in series between the input terminal in and the output terminal out. A capacitor $C_1$ is connected between an intermediate node between an input terminal in and ground, and a capacitor $C_2$ is connected between an intermediate node between the inductors $L_{11}$ and $L_{12}$ and ground.

The structures of the inductors $L_{11}$ and $L_{12}$ are the same as the structure of the variable inductor 100 of the first or second embodiment. Although the capacitors $C_1$ and $C_2$ are variable capacitors in FIG. 9A, the capacitors $C_1$ and $C_2$ have constant capacitances. As illustrated in FIG. 9B, by changing the inductances of the inductors $L_{11}$ and $L_{12}$, it is possible to change the circuit characteristic of the low-pass filter LPF and to change the frequency response.

The low-pass filter LPF differs from the high-pass filter HPF in that the ends of the inductors $L_{11}$ and $L_{12}$ are not grounded at all. This structure is not realized by the conventional inductor in which one of the both ends of the inductor is grounded. The variable inductors of the first and second embodiments are capable of changing the inductances without grounding, and may be connected in series between the input terminal and the output terminal. The variable inductors of the first and second embodiments are suitable particularly for the applications to the low-pass filters.

Fourth Embodiment

A fourth embodiment is an exemplary application of the variable inductor of the first or second embodiment to an amplifier circuit.

Figure 10A:
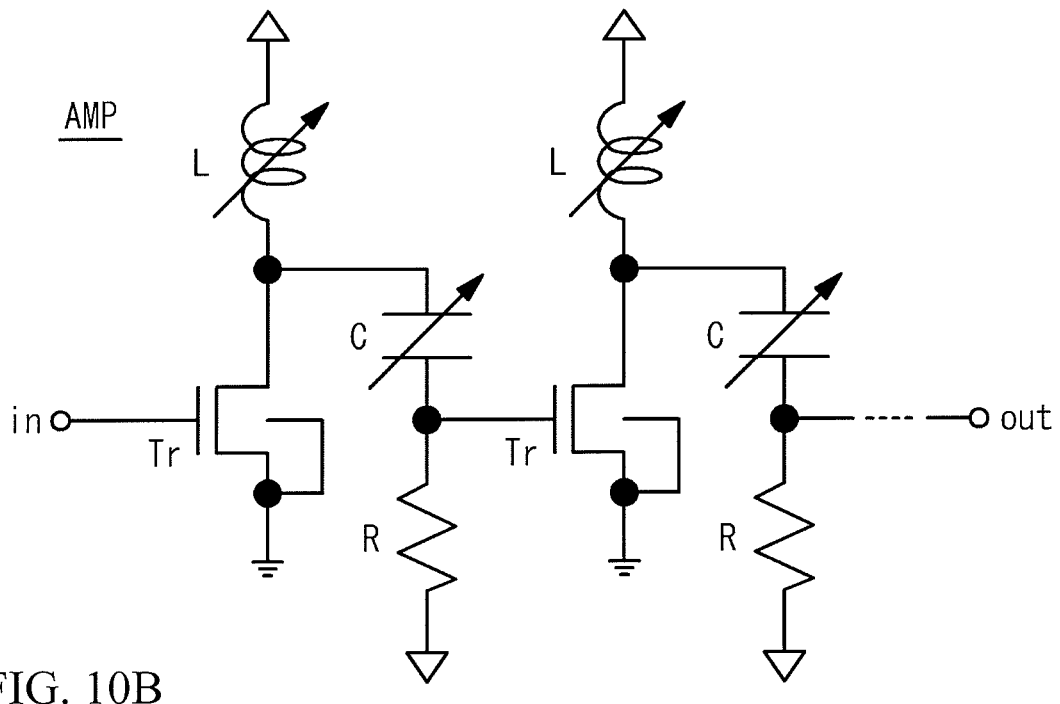
FIG. 10A is a circuit diagram of a frequency variable amplifier in accordance with a fourth embodiment.
Figure 10B:
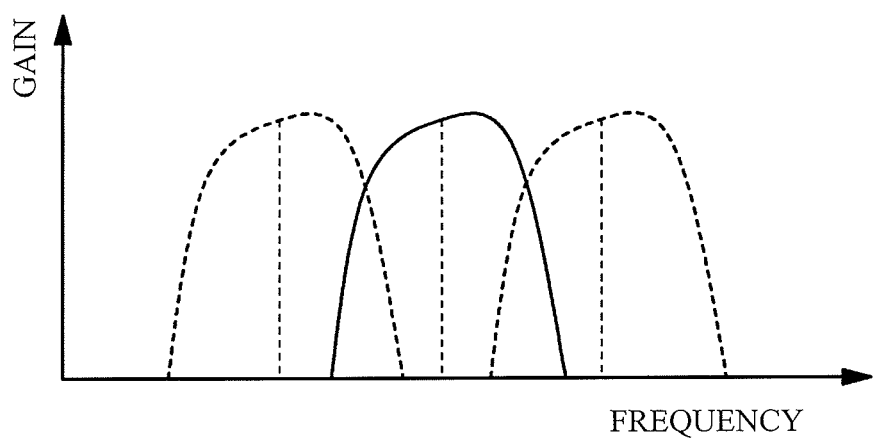
FIG. 10B is a graph of a circuit characteristic thereof.

FIG. 10A is a circuit diagram of a frequency variable amplifier in accordance with the fourth embodiment, and FIG. 10B is a graph of a circuit characteristic thereof. Referring to FIG. 10A, a frequency variable amplifier AMP is configured so that an inductor L and a transistor Tr are connected in series between a power supply line and a ground line. A capacitor C and a resistor R are connected in series between an intermediate node between the inductor L and the transistor Tr and another power supply line. An input terminal in is connected to the gate of the transistor Tr closest to the input terminal in. An output of a unit circuit composed of the transistor Tr, the inductor L, the capacitor C and the resistor R are extracted from an intermediate node between the capacitor C and the resistor R, and is applied to the gate of the transistor Tr of the next stage.

The inductors L are configured as the variable inductor 100 of the first or second embodiment. The capacitor C is not limited to the variable resistor but may have a fixed capacitance. As illustrated in FIG. 10B, by changing the inductances of the inductors L, it is possible to change the circuit characteristic of the frequency variable amplifier AMP and change the frequency to be amplified.

As described above, the variable inductors of the first and second embodiments may be applied to various circuits other than the filter circuits. The amplifier circuit of the present invention may be applied to, for example, amplifiers.

Fifth Embodiment

A fifth embodiment is a concrete example of the variable inductor configured according to the second embodiment.

Figure 11:
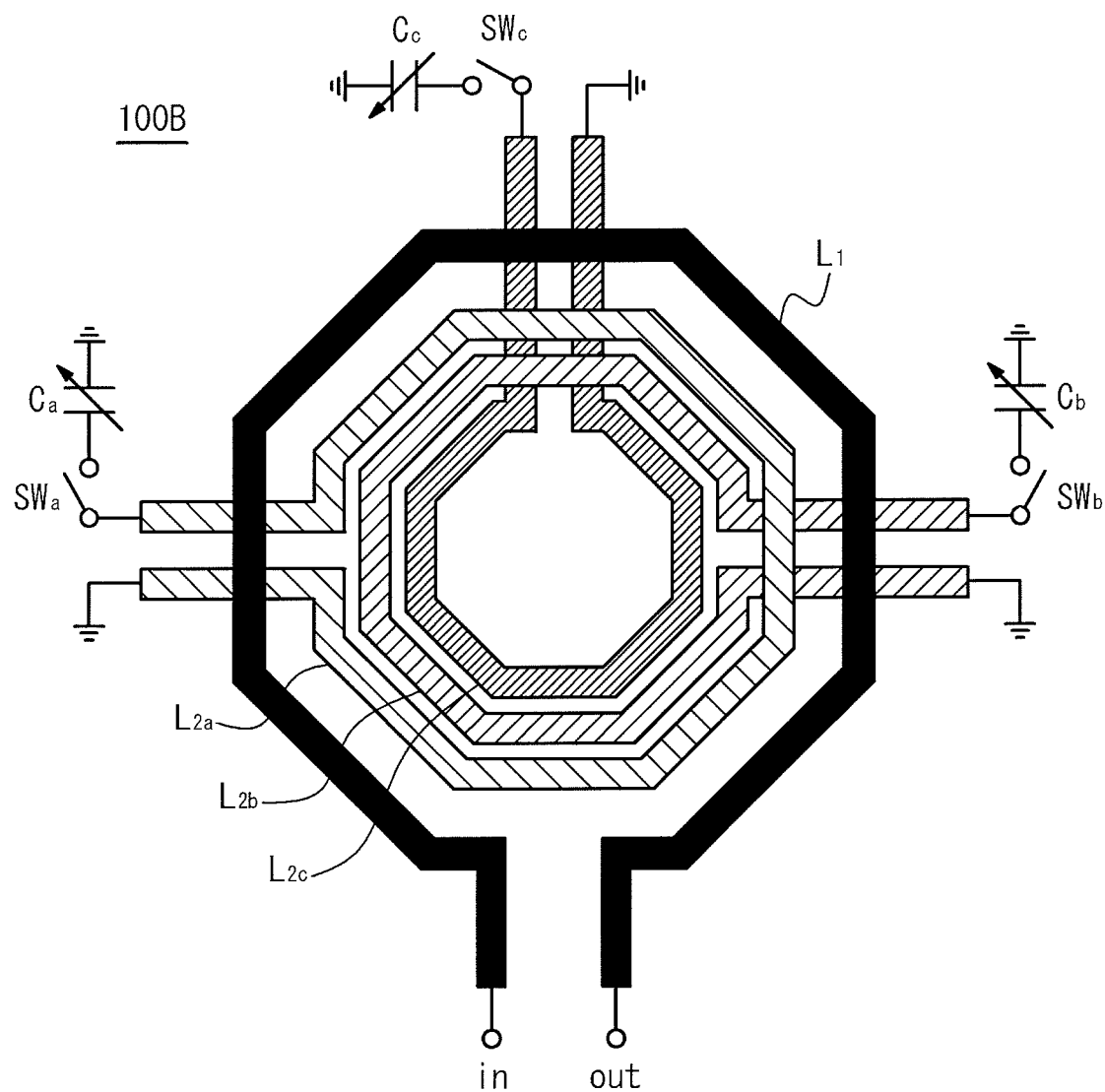
FIG. 11 is a diagram of a variable inductor in accordance with a fifth embodiment.

FIG. 11 is a diagram that illustrates a structure of a variable inductor in accordance with the fifth embodiment. In FIG. 11, a description of parts that are the same as those of the first embodiment (FIG. 1) is omitted here. A variable inductor 100B includes the first inductor $L_1$ connected to a signal circuit, and the multiple second inductors $L_{2a}$ through $L_{2c}$ provided for changing the inductance of the first inductor $L_1$. The switches $SW_a$ through $SW_c$ are respectively provided to the second inductors $L_{2a}$ through $L_{2c}$, and variable capacitors $C_a$ through $C_c$ are respectively connected in series with the switches $SW_a$ through $SW_c$. The variable capacitors $C_a$ through $C_c$ are examples of the additional impedances employed in the second embodiment, and may be variable capacitance diodes (varactor diodes). The variable capacitance diodes may be a silicon diode having a PN junction or may be compound semiconductor diode using a Schottky junction. The impedance may be continuously changed by applying a reverse bias to the variable capacitance diode and changing the magnitude of the reverse bias.

The variable inductor 100B of the fifth embodiment selectively opens or closes the switches SWa through SWc to select one of the second inductors $L_{2a}$ through $L_{2c}$ through which the induced current flows, and thus changes the inductance of the first inductor $L_1$. Further, one of the switches $SW_a$ through $SW_c$ is closed or turned ON and the impedance of the corresponding one of the variable capacitors $C_a$ through $C_c$ is changed, so that the current that flows through the corresponding one of the second inductors $L_{2a}$ through $L_{2c}$ may be changed continuously. It is thus possible to continuously change the inductance of the first inductor $L_1$ with the given range having the predetermined value in the center.

Figure 12:
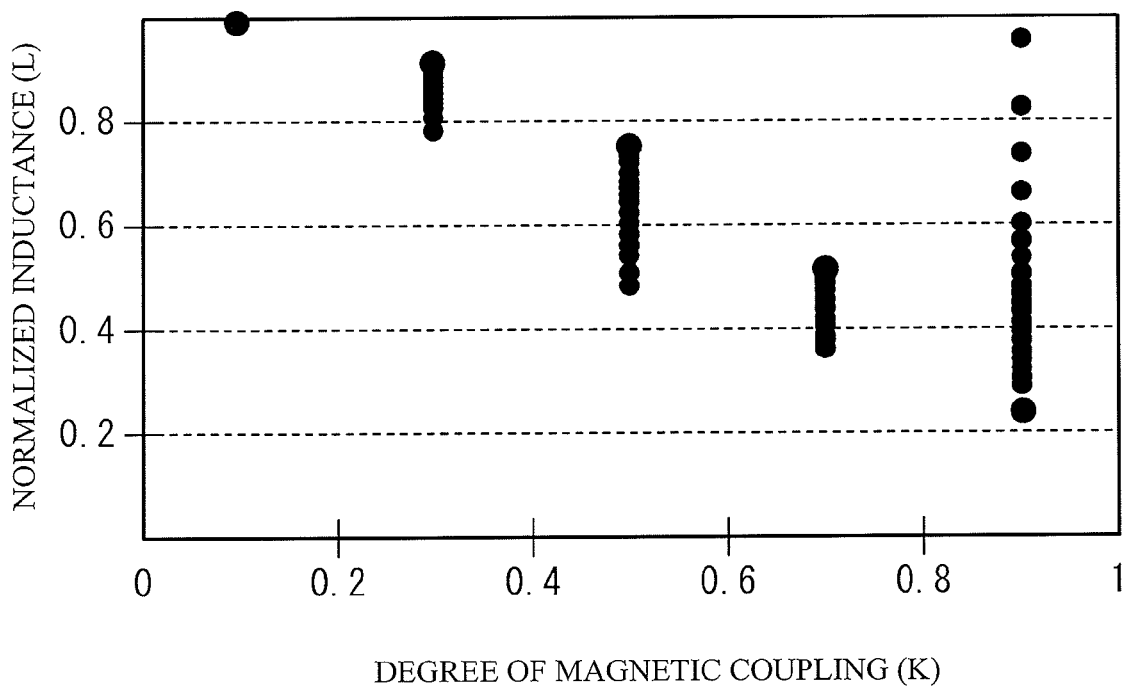
FIG. 12 is a graph of results of simulation of the variable inductor in accordance with the fifth embodiment.

FIG. 12 is a graph that illustrates results of a simulation in which the inductance of the variable inductor 100B of the fifth embodiment is changed, and corresponds to the conceptual diagram of FIG. 7 referred to in the second embodiment. The first inductor $L_1$ has an inductance of 1 nH, and the variable capacitors are varactor diodes having an additional impedance of 0Ω to 1Ω. The above values are suitable for the frequency range used in the portable phones (800 MHz to 2.5 GHz), and the first inductor $L_1$ is suitably used in the RF amplifier circuits of the portable phones.

As illustrated, it is confirmed that the inductance of the first inductor $L_1$ changes continuously within the given range when the degree K of magnetic coupling is 0.3, 0.5, 0.7 or 0.9. It is further confirmed that as the degree K of magnetic coupling becomes greater, the range in which the continuous change of inductance is available tends to expand. This is because that in expression (3) described previously, the inductance of the first inductor $L_1$ is determined by the product of the current $i_2$ that flows through the second inductor $L_{2a}$ and the degree K of magnetic coupling. That is, for the identical width of change of the current $i_2$, the greater the value of the degree K of magnetic coupling, the greater the change of the inductance of the first inductor $L_1$.

Sixth Embodiment

A sixth embodiment is an exemplary application of the amplifier circuit with the variable inductor of the fifth embodiment to an electronic device.

Figure 13:
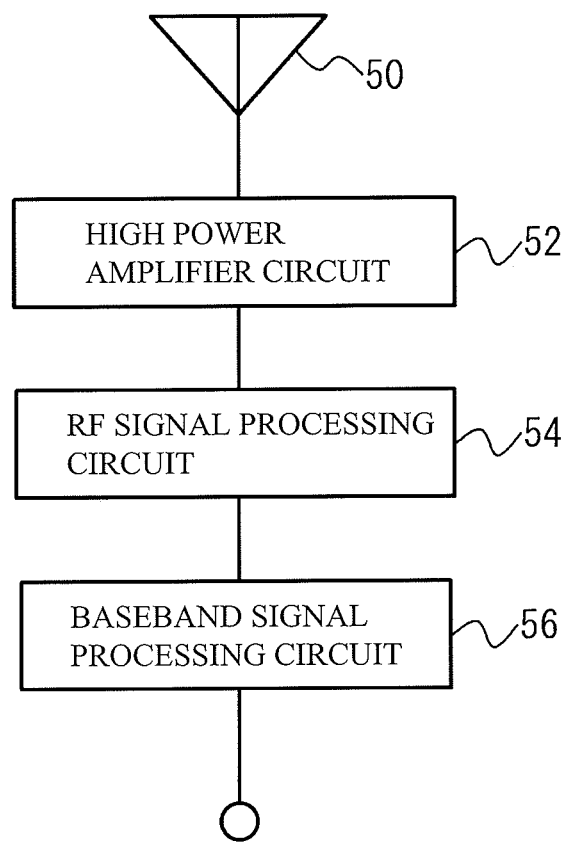
FIG. 13 is a diagram of a structure of a portable phone in accordance with a sixth embodiment.

FIG. 13 is a block diagram of a front end part of a portable phone. The front end part is configured to have a high power amplifier circuit 52, an RF signal processing circuit 54, and a baseband signal processing circuit 56, which circuits are connected in this order from an antenna 50. The baseband signal processing circuit 56 is connected to an internal circuit of the portable phone, and generates a baseband signal based on a signal from the internal circuit. The RF signal processing circuit 54 up-converts the baseband signal output by the baseband signal processing circuit 56 to thus generate an RF signal. The high power amplifier circuit 52 amplifies the RF signal up to a communication level for the portable phone, and outputs the amplified RF signal to the antenna 50.

Figure 14:
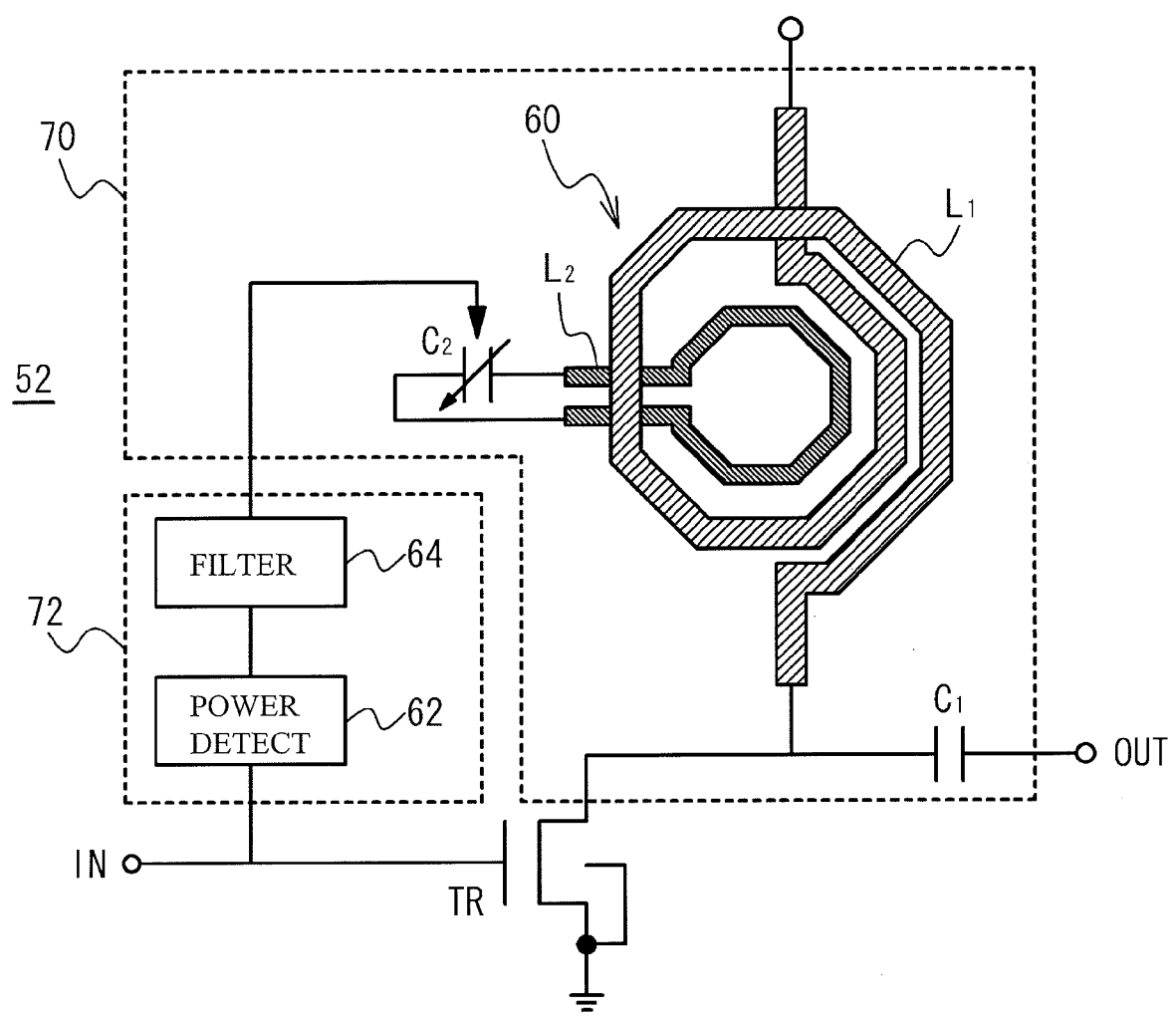
FIG. 14 is a circuit diagram of a structure of a high power amplifier circuit in accordance with the sixth embodiment.

FIG. 14 is a diagram of the high power amplifier circuit 52. An input terminal IN is connected to the gate of a transistor TR, which functions as an amplifier part. The source terminal of the transistor TR is grounded, and the drain terminal thereof serving as the output terminal is connected to a matching circuit 70, which has a variable inductor 60 and the capacitor $C_1$ connected in parallel. The matching circuit 70 functions to match the output impedance of the amplifier part (transistor TR). One end of the capacitor $C_1$ in the matching circuit 70 is connected to an output terminal OUT. The variable inductor 60 includes the first inductor $L_1$ and the second inductor $L_2$. The first inductor $L_1$ is connected between the transistor TR and a power supply terminal, and has a relatively large inner diameter. The second inductor $L_2$ is arranged inside the first inductor $L_1$ and has a relatively small inner diameter. A variable capacitor $C_2$, which is an additional impedance for changing current that flows through the second inductor $L_2$ is connected to the second inductor $L_2$. The present embodiment differs from the fifth embodiment in that no switch is connected to the second inductor $L_2$.

The high power amplifier circuit 52 is equipped with a control circuit 72, which controls the variable capacitor C2 on the basis of the magnitude of the input signal. The control circuit 72 includes a power detection circuit 62, and a filter circuit 64 that follows the power detection circuit 62. The power detection circuit 62 extracts part of the input signal applied to the high power amplifier circuit 52, and supplies the extracted part to the filter circuit 64. The filter circuit 64 may be formed by a low-pass filter, and outputs a signal that corresponds to an envelope portion of the input signal from which the carrier frequency component has been removed. The signal from the filter circuit 64 is applied to the variable capacitor $C_2$ of the varactor diode as the reverse bias. Thus, the impedance of the variable capacitor $C_2$ is changed based on the magnitude of the input signal, and the current that flows through the second inductor $L_2$ is changed. Thus, the inductance of the first inductor $L_1$ is changed, and the impedance of the matching circuit 70 with the first inductor $L_1$ is changed.

In the matching circuit 70, the impedance that maximizes the power added efficiency of the high power amplifier circuit 52 is different from the impedance that maximizes the saturated power (maximum output power) of the high power amplifier circuit 52. When the impedance of the matching circuit 70 is determined so that more weight is given to the power added efficiency, the saturated power decreases. When the impedance of the matching circuit 70 is determined so that more weight is given to power, the power added efficiency decreases. That is, there is a trade-off relation between the power added efficiency and the saturated power.

The high power amplifier circuit 52 of the sixth embodiment is configured to continuously change the impedance of the matching circuit 70 by continuously changing the variable inductor 60 by the control circuit 72. It is thus possible to arbitrarily determine the impedance of the matching circuit 70 so that more weight is given to the efficiency or power and to realize suitable adjustment based on the level of the input signal.

Figure 15:
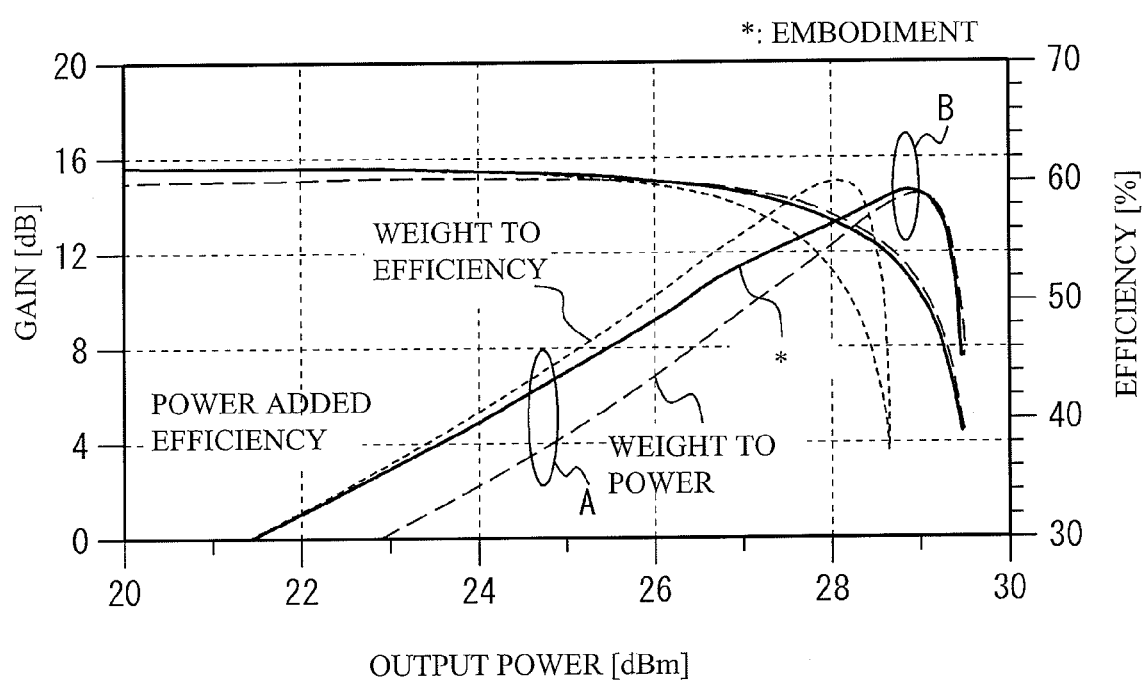
FIG. 15 is a graph of results of simulation of the high power amplifier circuit in accordance with the sixth embodiment.

FIG. 15 is a graph that illustrates results of simulation of the high power amplifier circuit 52. The horizontal axis of the graph denotes the output power of the circuit, and the relations with the vertical axis denotes the power added efficiency and the gain are indicated by respective curves. In the graph, solid lines indicate the present embodiment, fine dotted lines indicate a case where weight is given to the efficiency, and rough dotted lines indicate another case where weight is given to power. In the simulation, a general-use Si-CMOS (Complementary Metal Oxide Semiconductor) device is assumed, and the power supply voltage, the frequency and other parameters conform to the specification of the portable phones in Japan.

When the output power of the circuit is low, a small bias is applied to the variable capacitor via the control circuit 72. Thus, the capacitance of the variable capacitor $C_2$ reduces, and the impedance increases. Thus, the current that flows through the second inductor $L_2$ decreases, the inductance of the first inductor $L_1$ included in the matching circuit 70 increases. Thus, plots of the solid-line curve become close to the case where weight is given to the efficiency (a region A in FIG. 15).

In contrast, when the output power of the circuit is high, a large bias is applied to the variable capacitor via the control circuit 72. Thus, the capacitance of the variable capacitor $C_2$ increases, and the impedance decreases. Thus, the current that flows through the second inductor $L_2$ increases, and the inductance of the first inductor $L_1$ included in the matching circuit 70 decreases. Thus, plots of the solid-line curve become close to the case where weight is given to power (a region B in FIG. 15). As described above, according to the high power amplifier circuit 52 of the sixth embodiment, it is possible to realize circuit characteristics in which a good balance between the power added efficiency and the saturated power is achieved. For example, mobile communication devices such as portable phones may be designed to reduce consumption power as small as possible in view of the life of batteries. Thus, in the region in which the input power is relatively low, it is preferable that the amplifier circuit is controlled so that weight is given to the efficiency to reduce power consumption. In contrast, in the region in which the input power is relatively high, it is preferable that the amplifier circuit is controlled so that weight is given to power to increase power consumption.

The sixth embodiment has the exemplary structure in which the second inductor $L_2$ of the variable inductor 60 does not include any switch. However, a switch may be included in the second inductor $L_2$ of the variable inductor 60. The sixth embodiment may be varied so as to include a configuration that switches the multiple inductors $L_2$ in a manner similar to that of the fifth embodiment. With the above configuration, the inductance of the variable inductor 60 may be discretely changed within a wider range, and frequency matching may be carried out more easily. In order to finely adjust the amplifier circuit characteristics at the particular wavelength, it may be preferable to provide the second inductor $L_2$ with an adjust part (variable capacitor $C_2$) capable of continuously changing the inductance of the variable inductor 60.

In the fifth and sixth embodiments, the variable capacitor is used as the adjusting part that continuously adjusts the inductance of the variable inductor (or in other words, continuously changes the current that flows through the second inductor $L_2$). The adjusting part may be implemented by another structure. The variable capacitor may have a configuration other than the varactor diode.

The sixth embodiment is not limited to the portable phone but the amplifier circuit of the sixth embodiment may be applied to any electronic device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An electronic circuit comprising:
   a first inductor;
   multiple second inductors that are magnetically coupled with the first inductor, induced current flowing through the multiple second inductors by a magnetic field generated by the first inductor; and
   a current changing part that is connected to the multiple second inductors and is configured to change the induced current that flows through the multiple second inductors inductor,
   wherein the multiple second inductors are formed inside the first inductor and have different inner diameters,
   wherein the current changing part includes a switching part that switches the induced current flowing through each of the multiple second inductors to zero or a predetermined value other than zero so that inductance of the first inductor changes stepwise.

2. The electronic circuit as claimed in claim 1, wherein the switching part includes a switch that is connected between ends of the second inductor and opens or closes the second inductor.

3. The electronic circuit as claimed in claim 1, further comprising an adjusting part that continuously changes the induced current flowing through the second inductor within a given range.

4. The electronic circuit as claimed in claim 3, wherein the adjusting part includes an additional impedance that is connected to an end of the second inductor and continuously changes the impedance of the second inductor.

5. The electronic circuit as claimed in claim 4, wherein the additional impedance includes a variable capacitance diode.

6. The electronic circuit as claimed in claim 1, wherein the first inductor and the multiple second inductors include wiring patterns formed on a substrate.

7. The electronic circuit as claimed in claim 6, wherein the first inductor and the multiple second inductors are formed on an identical layer on the substrate.

8. The electronic circuit as claimed in claim 6, wherein the first inductor and the multiple second inductors are formed on different layers that are stacked so as to include an interposed insulating layer between the different layers.

9. The electronic circuit as claimed in claim 8, wherein the multiple second inductors are formed on different layers and include portions that overlap each other in a direction in which the different layers are stacked.

10. The electronic circuit as claimed in claim 1, further comprising an amplifier part that amplifiers an input signal, a matching circuit that includes the first inductor and matches an output impedance of the amplifier part, and a control part that controls the current changing part on the basis of the input signal and changes an impedance of the matching circuit.

11. The electronic circuit as claimed in claim 10, wherein the control circuit changes the impedance of the matching circuit so that a power added efficiency increases as the input signal decreases and a saturated power of the electronic circuit increases as the input signal increases.

12. The electronic circuit as claimed in claim 10, wherein the current changing part includes a variable capacitance diode connected to an end of the second inductor, and the control circuit changes the impedance of the matching circuit so that the saturated power of the electronic circuit increases as the input signal increases.

13. The electronic circuit as claimed in claim 1, comprising a low-pass filter circuit, and wherein the first inductor is included in the low-pass filter circuit.

14. The electronic circuit as claimed in claim 13, wherein the first inductor is connected in series between an input terminal of the low pass filter circuit and an output terminal thereof.

15. The electronic circuit as claimed in claim 1, further comprising a high-pass filter circuit including the first inductor.

16. An electronic device comprising the electronic circuit as claimed in claim 1.

* * * * *